Sept. 8, 1970 K. J. B. VAN LAER 3,528,090

METHOD OF PROVIDING AN ELECTRIC CONNECTION ON A SURFACE OF AN ELECTRONIC DEVICE AND DEVICE OBTAINED BY USING SAID METHOD

Filed Jan. 19, 1968

INVENTOR.
KARELJ.BLOK VAN LAER

BY

Frank R. Trifari
AGENT

United States Patent Office 3,528,090
Patented Sept. 8, 1970

1 2

3,528,090

METHOD OF PROVIDING AN ELECTRIC CONNECTION ON A SURFACE OF AN ELECTRONIC DEVICE AND DEVICE OBTAINED BY USING SAID METHOD

Karel Jakobus Blok van Laer, Nijmegen, Netherlands, assignor, by mesne assignments, to U.S. Philips Co., Inc., New York, N.Y., a corporation of Delaware Filed Jan. 19, 1968, Ser. No. 699,228
Claims priority, application Netherlands, Jan. 25, 1967, 6701136
Int. Cl. C23f *17/00;* H01l *7/00*
U.S. Cl. 204—15 4 Claims

ABSTRACT OF THE DISCLOSURE

A method of providing tinned bump contacts on a semiconductor device or integrated circuit, wherein on the device surface is provided a metal layer for plating and on the latter a non-solderable metal layer which is removed at the areas where the bump contacts are to be formed. The bump contacts are next formed by plating while the metallic layers are masked, after which the mask is removed and the device immersed in a solder bath, with the result that the solder coats only the bump contacts and does not adhere to the surrounding surface portions of the non-solderable layer.

Figure 1:
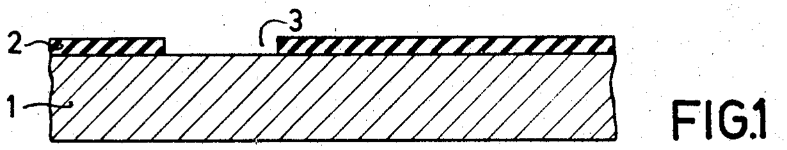

The invention relates to a method of providing an electric connection on a surface of an electronic device, in particular an integrated semiconductor crystal circuit, the surface of which may partly be formed by an insulating layer, for example, consisting of silicon dioxide or of a glass, for example, consisting of silicon dioxide and boron oxide ($B_2O_3$), the surface being first covered with a metal layer, hereinafter referred to as the cathode layer, and then with a masking layer comprising a window, after which at the area of said window a connection is formed by vapour-depositing metal on the cathode layer. Generally the masking layer and the cathode layer are at least partly removed subsequently. Of course the invention also comprises the case that the masking layer comprises more than one window and that a plurality of connections are formed. Such connections constitute bosses on the surface of the electronic device which may serve to secure external conductors thereto. External conductors are to be understood to mean herein those conductors which are not located in or on the electronic device itself.

Conductors, if any, which are located immediately on the surface or even below said surface are termed internal conductors.

The deposition of the metal in the windows of the masking layer is carried out according to a known method by electrodeposition with an external electric field, the underlying metal layer being connected as the cathode. Although for this reason, the layer is referred to here as the cathode layer, it is not intended to exclude the deposition of metal without the use of an electric field, particularly according to the so-called "electroless" method.

In order to connect the electric connections to external conductors, it would be preferable to secure them thereto by soldering and in that case it is desirable to coat them previously with a layer of metal which itself constitutes a solder or is easily wetted by a solder.

It is normal practice to previously tin-plate such parts to be soldered, but in the present case the connections are usually so small that a separate tin-plating thereof is not readily possible. Tin-plating by dipping in a bath of molten metal in a manner which is commonly used in printed circuits is possible in this case also but requires a mask for screening the components which are not to be covered with the molten metal. Photosensitive masking layers, which are often used in manufacturing electronic devices are not suitable for this purpose since they are not resistant to the temperature of the molten metals.

One of the objects of the invention is to provide a simple method of providing in the molten state a thin layer of metal on the connections without the danger existing of this metal adhering to other components.

According to the invention a cathode layer is used, the free surface of which, which is not to be covered by a connection, consists of a metal to which molten solder does not adhere, and the cathode layer with the connection is dipped in molten solder as a result of which said solder wets the connection but does not wet the cathode layer in as far as said layer consists of metal to which the solder does not adhere. The expression "this surface which consists of metal" is to be understood not to exclude the presence on this surface of an oxide skin formed from said metal.

Preferably just such a metal is chosen which is spontaneously covered in air with such an oxide skin.

Very suitable for this purpose is aluminium on which an oxide skin is very rapidly formed and to which the molten metal does not adhere at all. Another advantage of the use of aluminium for this purpose is that the provision of the layer may be carried out with apparatus which usually are present all the same because contacts on many semiconductive electronic devices consist of aluminium.

In order that the invention may be readily carried into effect, one example thereof will now be described in greater detail, with reference to the accompanying drawing, the figures of which diagrammatically show a cross-sectional view on a strongly enlarged scale of a diode in various stages of manufacture.

Figure 2:
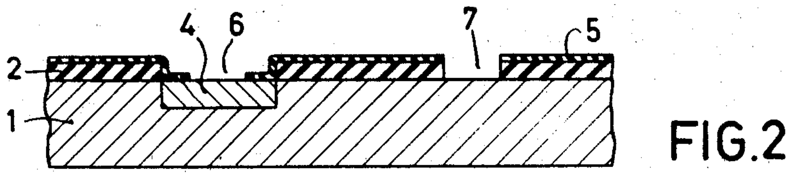
Figure 3:
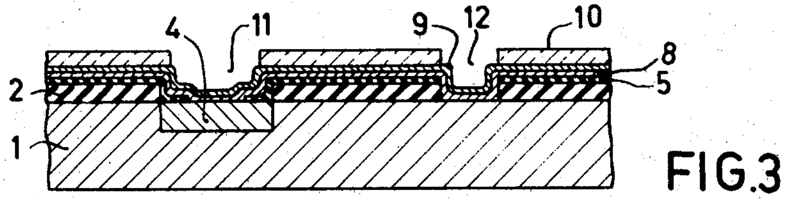

The starting product in this example is an n-type silicon wafer 1 on which a layer of oxide 2 is provided in normal manner and in which a window 3 is formed, see FIG. 1. By means of any of the commonly used diffusion treatments, a region 4 of the silicon wafer 1 located below said window, is converted into the p-type. A new oxide skin 5 may form in the window and the existing skin may be fortified. If this is not the case, such an oxide skin is provided in a separate treatment after which, by means of masking and etching, two windows 6 and 7 are provided therein (see FIG. 2). These windows give access to the region 4 consisting of p-type silicon and to the original material of the n-type.

A layer of silver 8, thickness 1 micron, is then vapour-deposited throughout the surface on which, likewise by vapour deposition, a layer of aluminium 9, 5000 A. thickness, is provided. This layer is coated with a photosensitive masking layer 10 in which two apertures 11 and 12 are provided in normal manner photographically at the area of the original windows 6 and 7. The assembly is then transferred to an etching bath consisting of 3 volumes of concentrated nitric acid ($HNO_3$), 1 vol. of phosphoric acid ($H_3PO_4$) and 20 vol. of water, at 25° C., until the free aluminium in the aperture 11 and 12 is dissolved.

Figure 4:
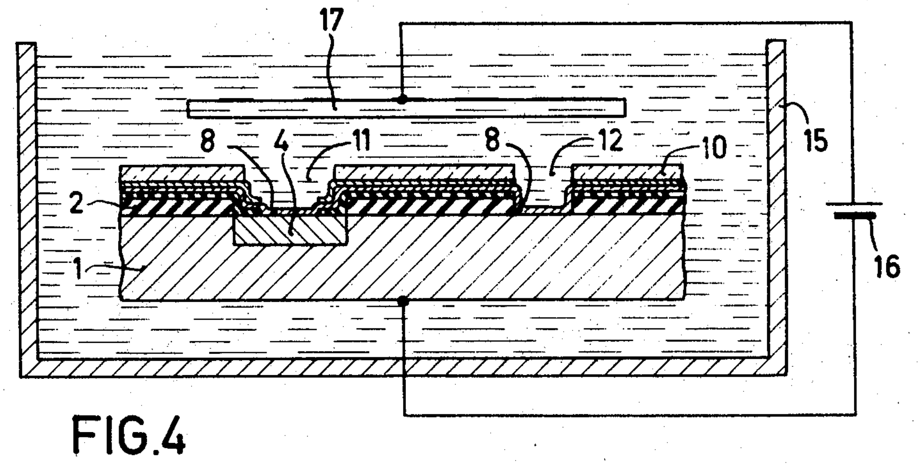
Figure 5:
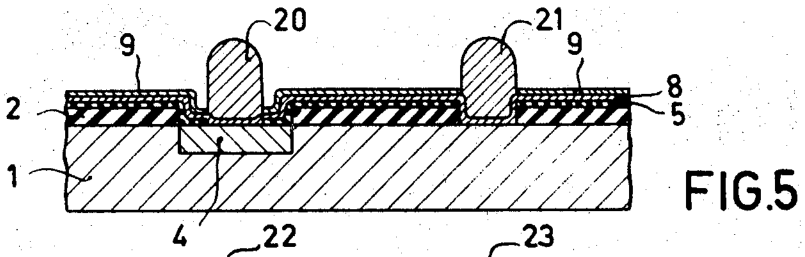

The assembly is then transferred to an electroplating bath 15 and the silicon wafer 1 is connected to the negative terminal of a batttery 16 while above the wafer a copper anode 17 is arranged. In this case the electroplating current of the wafer 1 at the area of the aperture 12 can flow directly to the layer 8 serving as the cathode. In other configurations the negative terminal of the battery may be connected, if required, directly to the silver layer 8, for example, at or near the edge of the wafer. It is to be noted that in FIG. 4 the normal screenings around conductors which are dipped in the bath 15, such as the lead connected to the wafer 1, and which screenings must serve to prevent deposition of the metal at undesired places, or to prevent corrosion, are not shown. In this case the bath may consist of a solution of 200 gms. of copper sulphate ($CuSO_4$) in one litre of water to which 50 gms. of concentrated sulphuric acid ($H_2SO_3$) is added. At a temperature of 45° C. and a voltage of ⅕ volt, two copper connections 20 and 21, height approximately 10 microns, are deposited in the bath.

The masking layer 10 is then removed.

The surface of the wafer is now covered entirely with the aluminium layer 9 except for the places where the connection 20 and 21 are situated. By dipping in molten solder, for example, consisting of 60% by weight of tin and 40% by weight of lead, at 300° C., the connections are covered with solder layers 22 and 23, while the aluminium is not wetted.

The remaining parts of the aluminium layer 9 are then removed with the above described etching agent consisting of 3 vol. of concentrated nitric acid ($HNO_3$), 1 vol. of phosphoric acid ($H_3PO_4$) and 20 vol. of water, at 25° C., while the excessive parts of the silver layer 8 are dissolved in a bath consisting of 1 vol. of concentrated hydrochloric acid (HCl), 1 vol. of concentrated nitric acid ($HNO_3$) and 100 vol. of water, at 30° C.

Figure 6:
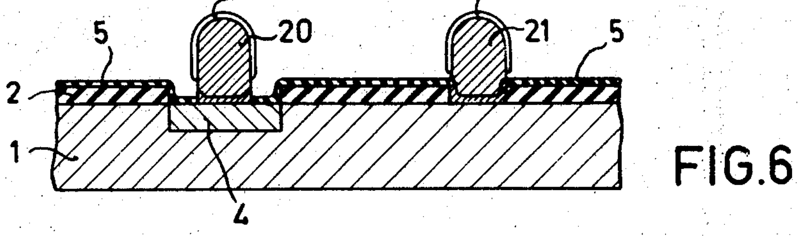

Another method of removing the silver is to wash it away by means of a powerful jet of water while making use of the poor adhesion of the silver to the oxide layer 5. The final result is shown in FIG. 6.

What is claimed is:

1. A method of providing a solder-coated electrical connection on a surface of a semiconductor device containing active zones, comprising forming on a surface of the device containing an active zone a first metallic layer of a surface composition which will accept a plated metal but which is not wetted by molten solder, said first layer contacting the active zone and surface portions of the device beyond the active zone, masking the surface of said first layer except for at least one area where a built-up plated connection is to be provided, subjecting the said device to a plating operation for building up on the unmasked portions of the first layer a plated metal capable of being wetted by molten solder, thereafter removing the mask exposing the surface of the first layer except where the plated metal has been desposited, immersing at least the surface of the so-formed device into a bath of molten solder causing the solder to adhere to the plated metal portions but not the surrounding first layer which it will not wet, and removing the device to solidify the solder coating on the plated metal portions serving as electrical connections to the device.

2. A method of providing a solder-coated electrical connection on a surface of a semiconductor device containing active zones exposed through holes in an insulating layer on the said surface, comprising forming on said surface of the device containing an active zone a first metallic layer of a composition which will accept a plated metal and which is wetted by molten solder, said first layer contacting the active zone and extending on the insulating layer beyond the active zone, forming on the first layer a second metallic layer of a composition which is not wetted by molten solder, masking the surface of said second layer except for at least one area where a built-up plated connection is to be provided, removing the second layer portions exposed by the mask thereby exposing the underlying portions of the first layer, thereafter subjecting the said device to a plating operation for building up on the unmasked portions of the first layer a plated metal capable of being wetted by molten solder, thereafter removing the mask exposing the surface of the second layer except where the plated metal has been deposited, thereafter immersing at least the surface of the so-formed device into a bath of molten solder causing the solder to adhere to the plated metal portions but not the surrounding second layer which it will not wet, removing the device to solidify the solder-coating on the plated metal portions serving as electrical connections to the device, and thereafter removing the first and second layer except at the solder-coated plated metal portions.

3. A method as set forth in claim 3 wherein the second layer is of aluminium.

4. A method as set forth in claim 3 wherein the first layer is of silver.

References Cited

UNITED STATES PATENTS

| | | | |
|---|---|---|---|
| 3,408,271 | 10/1968 | Reissmueller et al. | 204—15 |
| 3,386,894 | 6/1968 | Steppat | 204—15 |

HOWARD S. WILLIAMS, Primary Examiner

R. L. ANDREWS, Assistant Examiner

U.S. Cl. X.R.

204—38; 117—107; 29—578